United States Patent [19]
Yamasaki et al.

[11] Patent Number: 5,127,058
[45] Date of Patent: Jun. 30, 1992

[54] GAIN CONTROLLER

[75] Inventors: Hidenori Yamasaki; Jiro Naito, both of Hyogo, Japan

[73] Assignee: Mitsubishi Denki Kabushiki Kaisha, Tokyo, Japan

[21] Appl. No.: 454,030

[22] Filed: Dec. 20, 1989

[30] Foreign Application Priority Data

Jan. 6, 1989 [JP] Japan .................... 1-1505

[51] Int. Cl.⁵ .............................. H03G 9/00
[52] U.S. Cl. .............................. 381/102
[58] Field of Search .............. 381/102, 103, 101, 98, 381/28, 120, 107, 105, 119, 104; 455/249

[56] References Cited

U.S. PATENT DOCUMENTS

| | | | |
|---|---|---|---|
| 3,293,364 | 12/1966 | Richter | 381/103 |
| 4,396,806 | 8/1983 | Anderson | 381/103 |
| 4,885,792 | 12/1989 | Christensen et al. | 381/119 |
| 4,888,811 | 12/1989 | Takashi | 381/101 |
| 4,926,485 | 5/1990 | yamashita | 381/28 |

FOREIGN PATENT DOCUMENTS

| | | | |
|---|---|---|---|
| 5944460 | 9/1985 | Japan | 381/107 |
| 63-92418 | 6/1988 | Japan | |
| 63-111015 | 7/1988 | Japan | |
| 0176106 | 7/1989 | Japan | 381/103 |

OTHER PUBLICATIONS

J. R. Cox, "Squealer Killer with Real-Time Equalization", Journal of the Audio Engineering Society, vol. 32, No. 3, Mar. 1984.
Patent Abstracts of Japan, vol. 12, No. 423, Nov. 9, 1988.
Patent Abstracts of Japan, vol. 13, No. 453, Oct. 12, 1989.

Primary Examiner—Forester W. Isen
Attorney, Agent, or Firm—Burns, Doane, Swecker & Mathis

[57] ABSTRACT

An improved gain controller for use in an audio equipment for controlling a gain of an audio signal without causing any clipping distortion and keeping a good S/N ratio. The gain controller in accordance with this invention comprises a tone controller for setting a frequency characteristic for attaining a preferable tone, a first electronic volume controller arranged at the front stage of the tone controller for attenuating an input signal, a second electronic volume controller arranged at the rare stage of the tone controller for attenuating the signal therefrom and a microprocessor for controlling the first electronic volume controller, the second electronic volume controller and the tone controller in a cooperative manner, thereby the amount of attenuation at the first electronic volume controller is determined by the microprocessor in response to the selected frequency characteristic in the tone controller and the amount of attenuation at the second electronic volume controller is determined by the microprocessor in response to the total attenuation in the whole system.

13 Claims, 10 Drawing Sheets

GAIN CONTROLLER

BACKGROUND OF THE INVENTION

1. Field of the Invention

The present invention relates to a gain controller for use in an apparatus comprising a frequency characteristic controller (hereinafter called tone controller) and, more particularly, to a gain controller of the type capable of controlling a gain in the apparatus by maintaining a good S/N ratio and preventing a clipping distortion from causing upon saturation in the tone controller.

2. Description of the Prior Art

Heretofore, an electronic volume control circuit has been used in an audio equipment such, for example, as it is shown in the disclosure of Japanese Laid-open Utility Model Application No. 63-92418 hereby incorporated as the prior art by reference. In such electronic volume control circuit, a first depression detection signal is fed to a control circuit when a first push button switch is depressed for controlling the electronic volume controller to increase a resistance value thereof and a second depression detection signal is fed to the control circuit when a second push button switch is depressed for controlling the electronic volume controller to decrease a resistance value thereof, thereby if the first and the second depression detection signals are fed simultaneously to the control circuit, the electronic volume controller is so adjusted as to be set to a certain amount of value under the control of the control circuit.

Further, the disclosure of Japanese Utility Model Publication No. 63-111015 is incorporated as the prior art tone control device for audio equipments by reference. In such tone control device, a tone characteristic for a reproduced sound is set by a tone quality setting unit and the selected tone qualities for respective sound sources are stored in a memory unit, the tone quality of an audio signal selected one out of several sound sources is controlled on the basis of the corresponding tone characteristic thereto by means of a tone controller, and the tone characteristic that corresponds to the selected sound source is read from the memory unit when the reproduction of the selected sound source is started and fed to the tone controller by means of a control unit.

FIG. 1 shows a schematic diagram of an audio equipment comprising the prior art tone controller, wherein numeral 1 denotes a tone controller, numeral 6 denotes a fixed attenuator made up of fixed resistors and numeral 7 denotes a volume controller made up of a variable resistor.

The tone controller 1 is provided for changing a frequency characteristic by setting a gain and an attenuation against a specific frequency band, thereby a frequency spectrum of an audio signal can be varied.

On the other hand, the volume controller 7 is provided for attenuating the audio signal uniformly across the whole band by a discretionary amount of level.

The operation of the prior art will now be described more in detail, if the frequency characteristic of the tone controller 1 is so set as to be "0" dB gain within a lower frequency band A and "a" dB gain within a higher frequency band B, relative gains in the frequency characteristic of the audio signal at input points between blocks will be shown in FIGS. 2a-2c. Firstly, a level of an input signal "i" to the fixed attenuator 6 of FIG. 1 is set to "0" dB as it is shown in FIG. 2a and this level is assumed to be an allowable amplitude for the tone controller 1. The level of an output signal "ii" of the fixed attenuator 6 is attenuated by an amount of "b" dB in the whole frequency band as it is shown in FIG. 2b. Accordingly, there needed is the setting of the maximum input level in advance against the tone controller 1 in consideration of the maximum boosting (the maximum gain) value thereof.

In other words, it is necessary that the attenuation of "b" dB that conforms to a margin should be allocated within the allowable input value for the tone controller 1. Therefore, the amount of margin "b" dB is so selected as to be such a value within which a voice signal is not clipped even at the maximum boosting in the tone controller 1. Then an output boosted by the amount of "a" dB at the higher frequency band B is attained from the tone controller 1 as it is shown in FIG. 2c.

As it has been described above, in the audio equipment comprising the prior art tone controller, the margin provided for the tone controller will be of no use if there is no boosting in the tone controller and resulting in the attenuation of the audio signal level less than required signal level. This, in turn, aggravates the S/N ratio and deteriorates the quality of the audio signal.

It is therefore an object of this invention to eliminate the problems as described above and to provide a gain controller comprising a tone controller from which an audio signal secured of good S/N ratio is derived in all the time regardless of an amount of boosting such as of no boosting as well as of small amount of boosting therein.

SUMMARY OF THE INVENTION

A gain controller in accordance with the present invention comprises a first electronic volume controller provided at the front stage of a tone controller, a second electronic volume controller provided at the rare stage of the tone controller and a microprocessor for controlling the first electronic volume controller, the second electronic volume controller and the tone controller in a cooperative manner. The microprocessor in the gain controller according to this invention provides the controls in such a manner as to attenuate an input signal at the first electronic volume controller by a required amount that corresponds to the amount of gain (boosting), which is needed for executing the selected frequency characteristic, in the tone controller before applying thereto and to make an amount of attenuation at the second electronic volume controller to conform to the difference between the whole attenuation of the equipment and the amount of attenuation given at the first electronic volume controller.

DESCRIPTION OF THE PREFERRED EMBODIMENT

Figure 1:
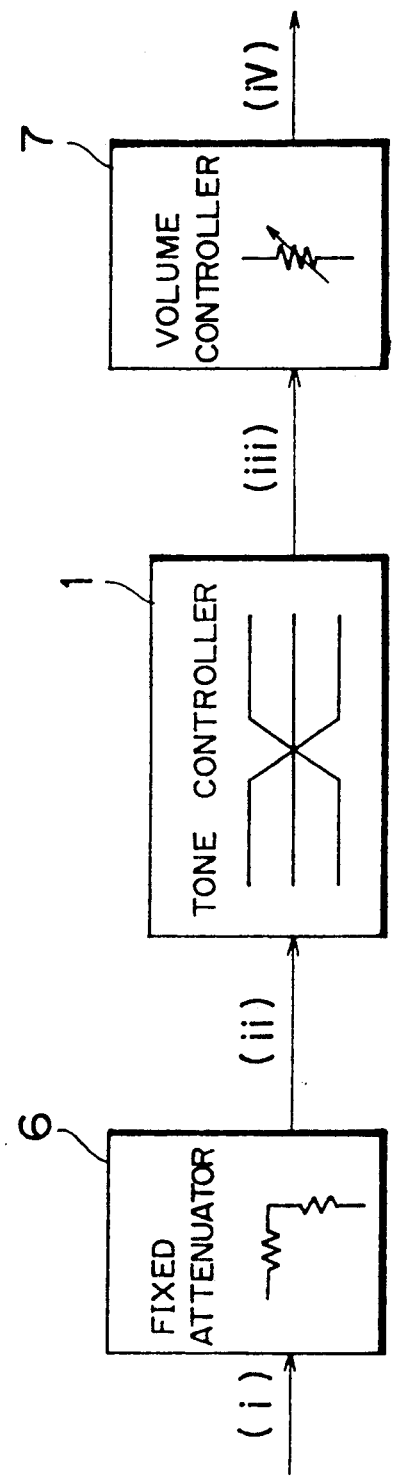
FIG. 1 is a block diagram showing an arrangement of a prior art audio equipment.
Figure 2A:
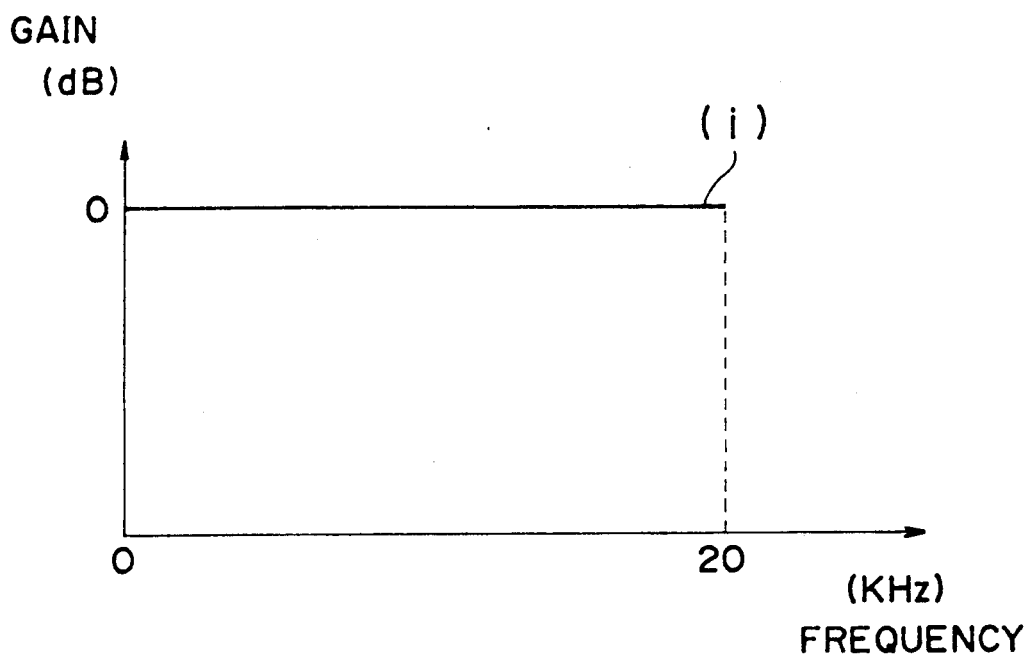
FIGS. 2a-2c are diagrams showing frequency characteristics for illustrating amounts of attenuations at various points in the prior art audio equipment shown in contrast with FIG. 4.
Figure 2B:
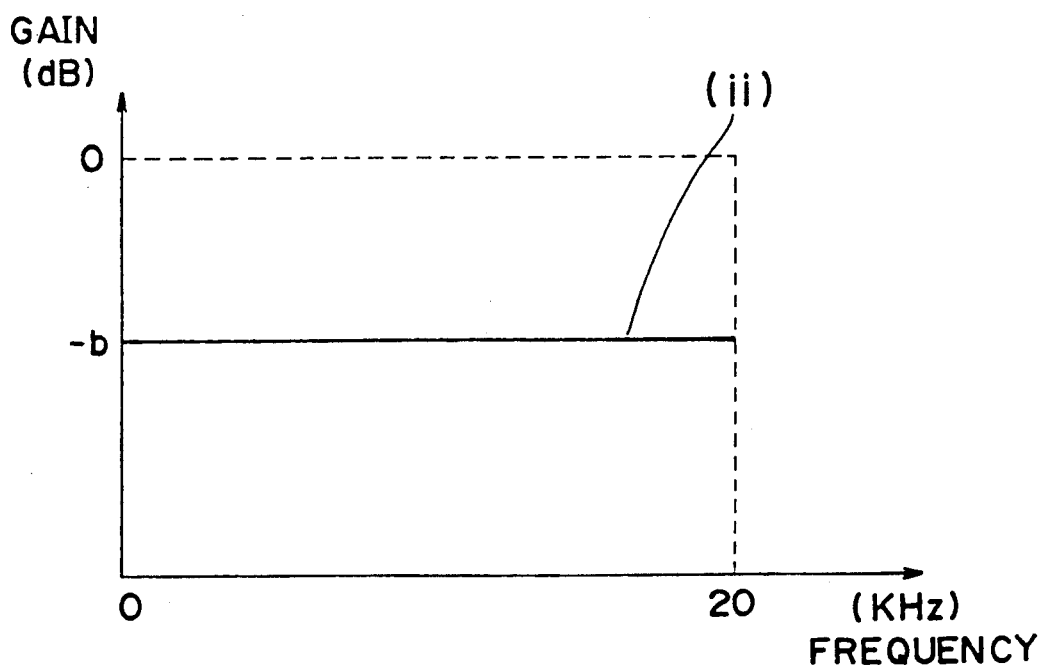
Figure 2C:
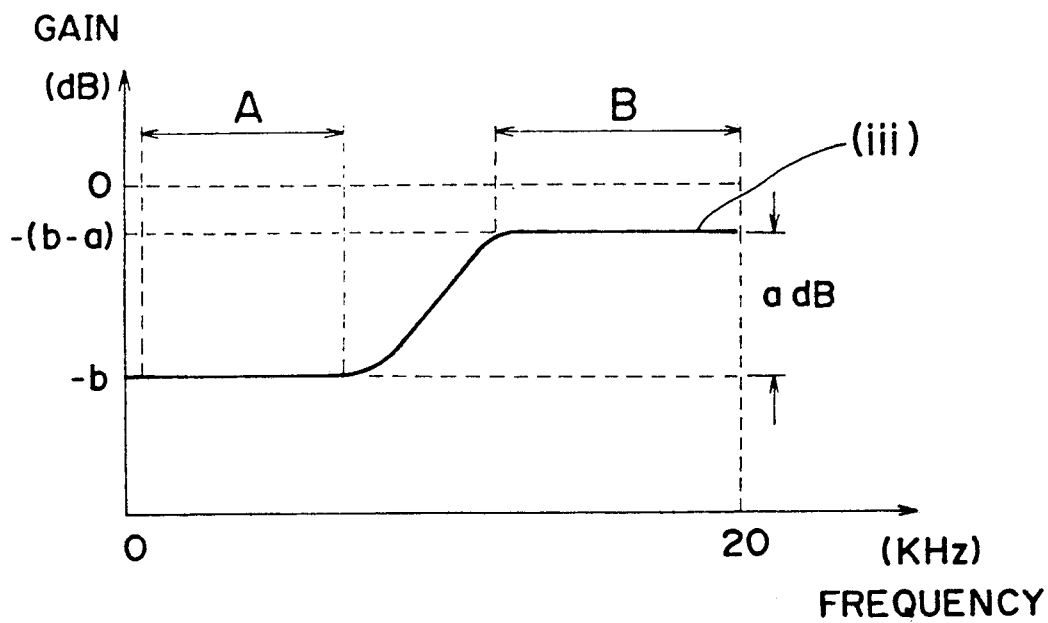
Figure 3:
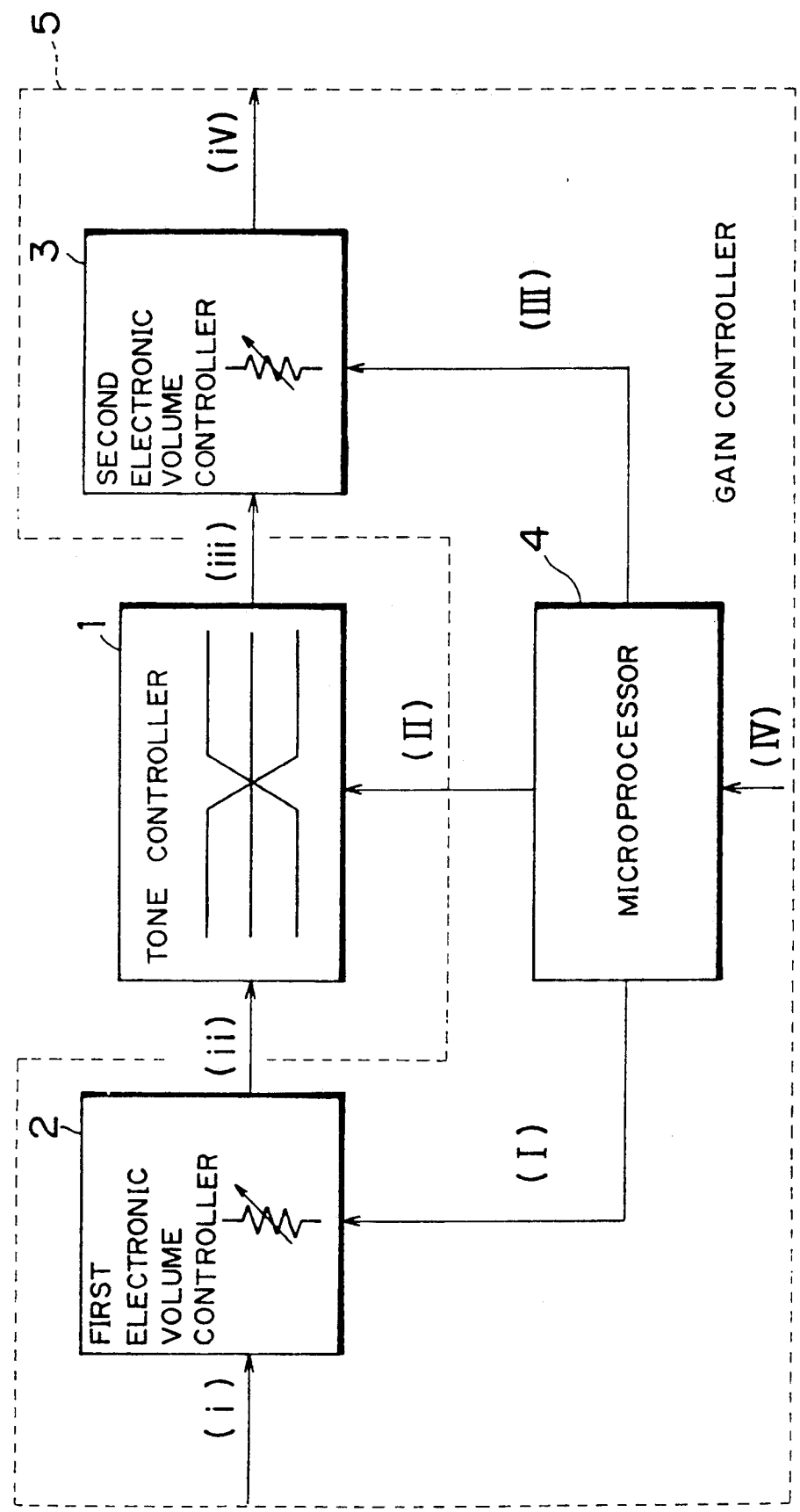
FIG. 3 is a block diagram showing a gain controller in accordance with an embodiment of this invention.

A preferred embodiment of the present invention will now be described more in detail with reference to the accompanying drawings. Referring now to FIG. 3, there is shown an embodiment of this invention in a block diagram, wherein numeral 1 denotes a tone controller to be used as a frequency characteristic controller, numeral 2 denotes a first electronic volume controller to be used as an attenuator and is provided at the front stage of the tone controller 1, numeral 3 denotes a second electronic volume controller to be used another attenuator and is provided at the rare stage of the tone controller 1 and numeral 4 denotes a microprocessor.

The tone controller 1, the first electronic volume controller 2 and the second electronic volume controller 3 are operated in a cooperative manner under the control of the microprocessor 4. More specifically, an amount of attenuation of the first electronic volume controller 2 and that of the second electronic volume controller 3 are determined by the microprocessor 4 in response to the frequency characteristic which has been set in the tone controller 1.

Figure 4:
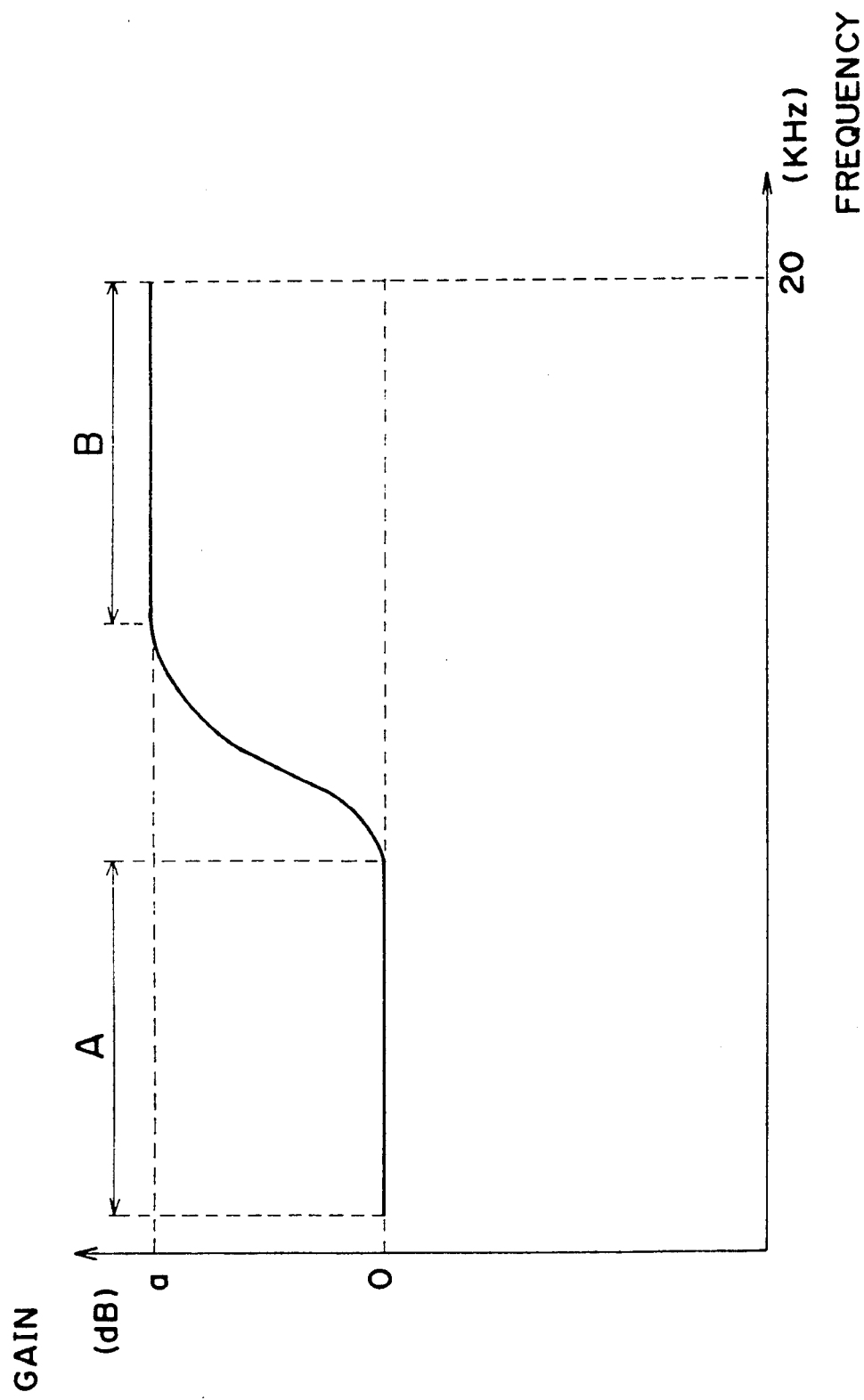
FIG. 4 is a diagram showing a frequency characteristic of a tone controller in the embodiment above.
Figure 5:
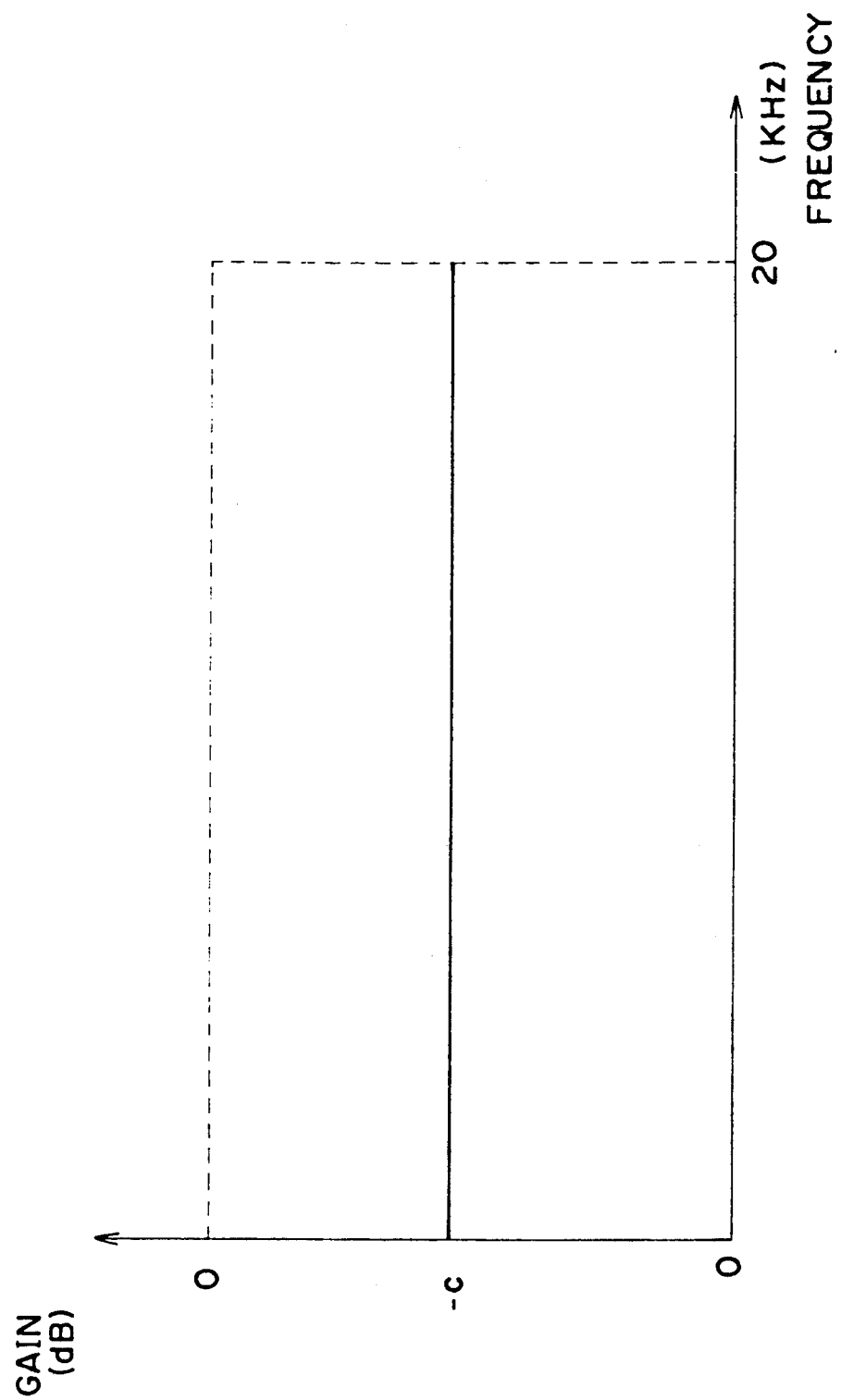
FIG. 5 is a diagram showing a frequency characteristic for illustrating the sum of attenuations of the first and second electronic volume controllers in the embodiment above.
Figure 6A:
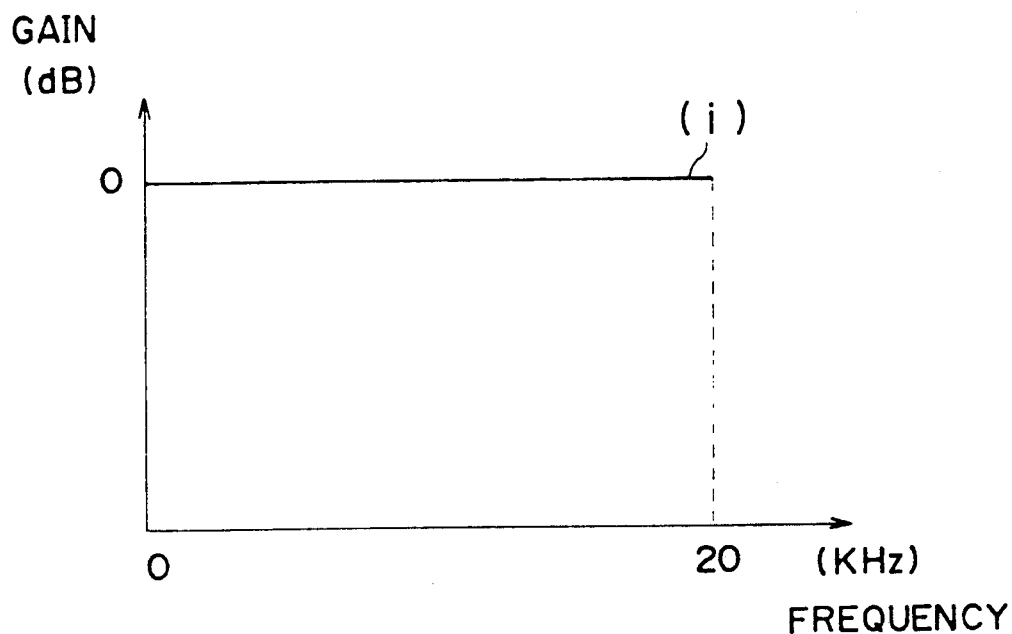
FIGS. 6a-6c are diagrams showing frequency characteristics for illustrating amounts of attenuations at the various points of the gain controller in accordance with the invention with reference to the characteristics shown in FIG. 4 and FIG. 5.
Figure 6B:
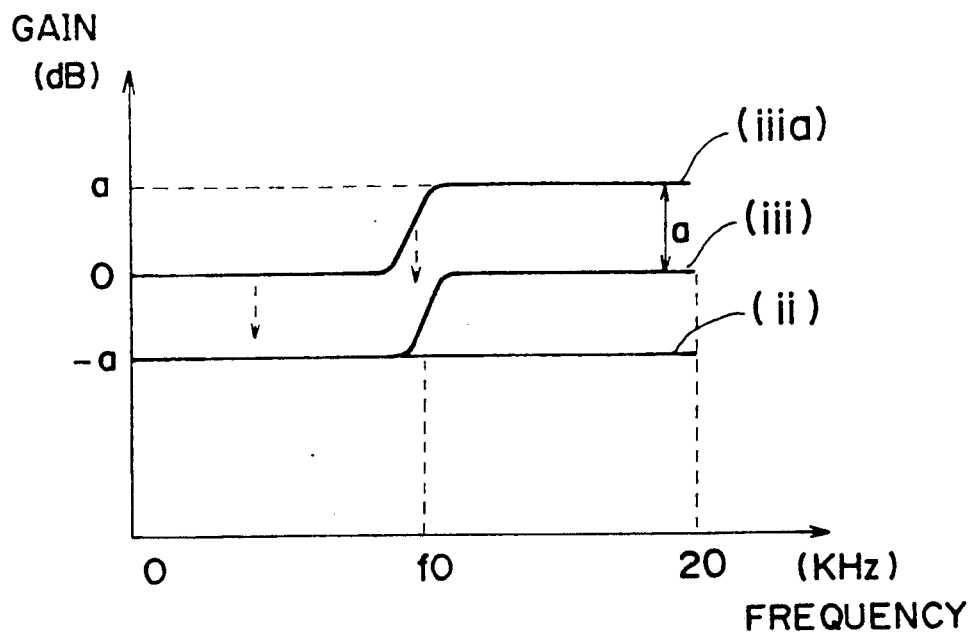
Figure 6C:
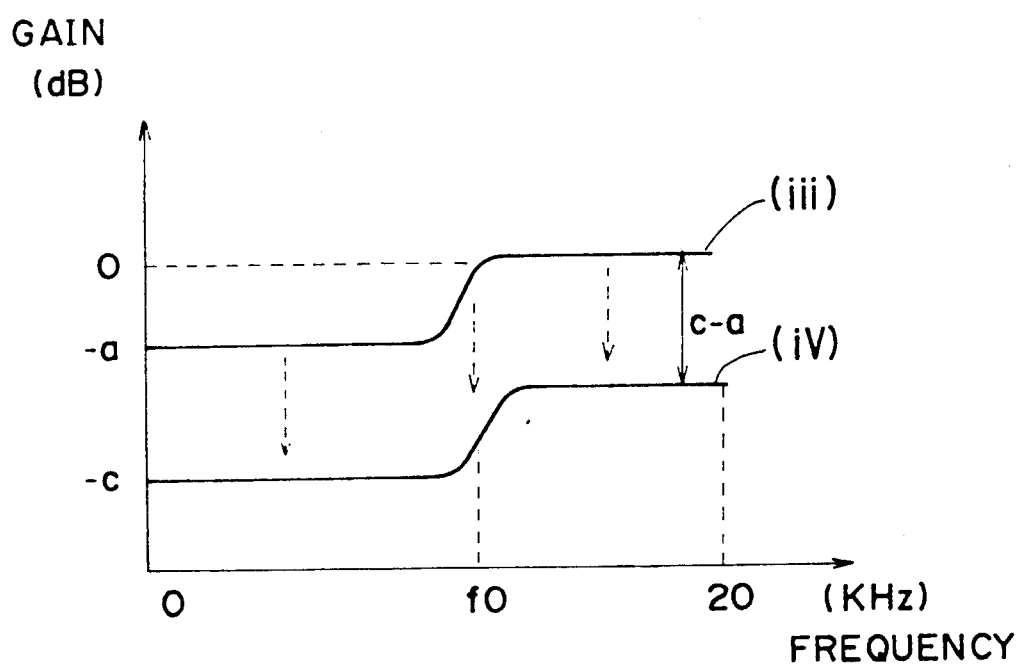

As seen, the first electronic volume controller 2, the second electronic volume controller 3 and the microprocessor 4 constitute the gain controller 5 of the present invention. The frequency characteristics at the various points of the gain controller are illustrated in FIGS. 6a-6c provided that the frequency characteristic of the tone controller 1 is so selected as to have "a" dB gain within a higher frequency band B as it is shown in FIG. 4 and the total attenuation of the gain controller 5 or the sum of the attenuations of the first and second electronic volume controllers 2, 3 is so selected as to be "c" dB within the whole frequency band as it is shown in FIG. 5. Where (i)-(iv) denote audio signals in-between the blocks of FIG. 3.

Referring to FIG. 6a, the shown frequency characteristic illustrates the input signal level of 0 dB of the first electronic volume controller 2. This is an allowable signal level for the tone controller 1 not to cause clipping distortions at when the frequency characteristic thereof is set to zero in the amount of boosting or no amplification therein.

Accordingly, the microprocessor 4 controls the first electronic volume controller 2 to attenuate the input signal (i) by the amount of "a" dB within the whole frequency band since the frequency characteristic of the tone controller has been set to that shown in FIG. 4. The attenuated input signal is shown by (ii) in FIG. 6b. Therefore, the gain frequency characteristic for the signal at the output point of the tone controller 1 is shown by (iii) in FIGS. 6b and 6c and the maximum level does never exceed 0 dB.

If the input signal is not attenuated at the first electronic volume controller 2, the signal will exceeds the 0 dB level at the maximum level thereof in the tone controller as it is shown by (iiia) in FIG. 6b and this will result in the clipping distortion to be encountered in the tone controller 1.

The microprocessor 4 then controls the second electronic volume controller 3 to attenuate the signal by an amount of "c−a" dB, which is the difference between the total attenuation "c" dB of the gain controller 5 and the attenuation "a" dB at the first volume controller 2 as they are shown in FIG. 6c, for providing the final gain frequency characteristic shown by (iv) in FIG. 6c.

Figure 7:
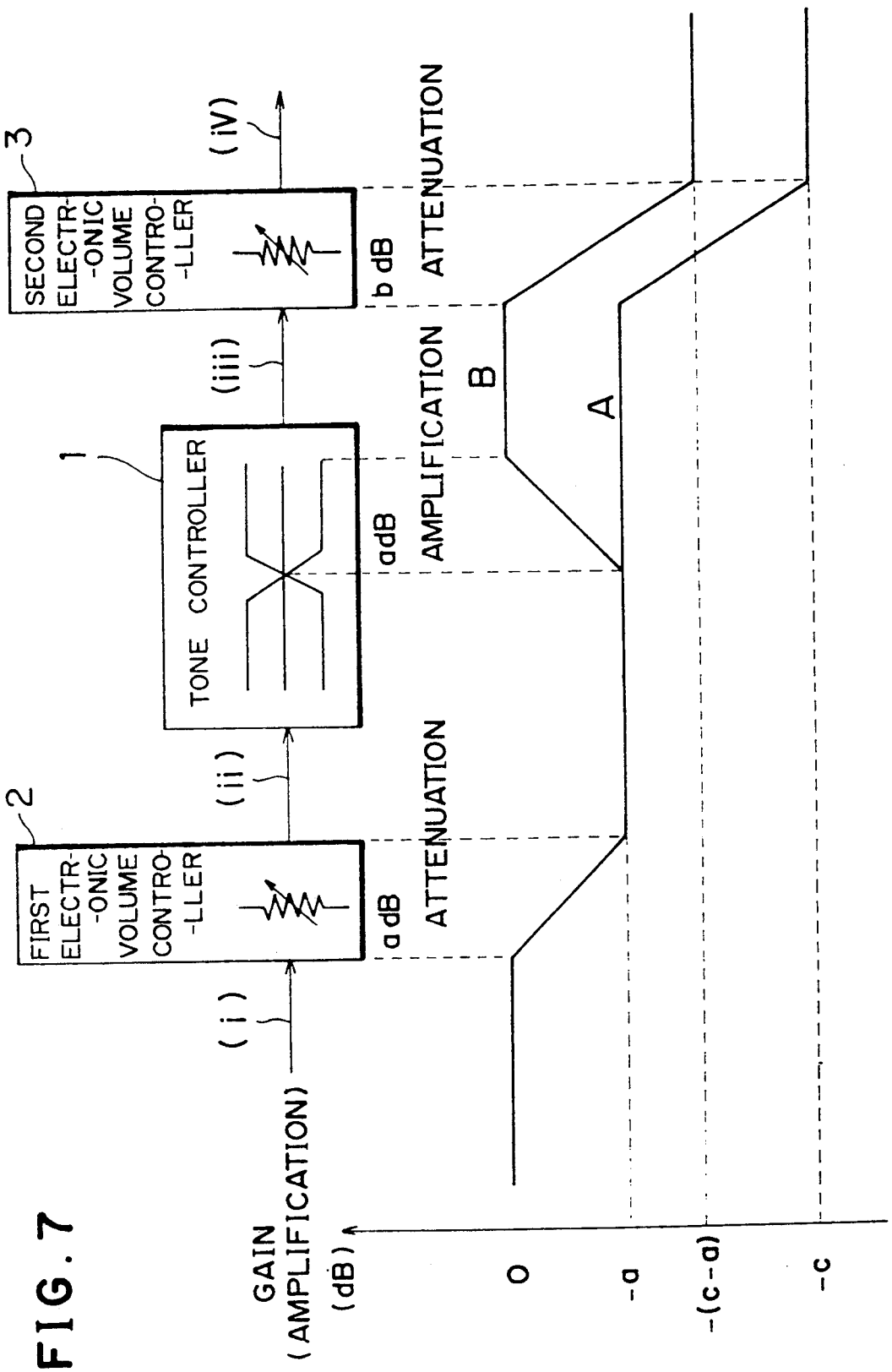
FIG. 7 is a block diagram for illustrating the signal level change along the blocks of the gain controller in accordance with this invention with reference to the characteristics shown in FIG. 4 and FIG. 5.

A state of gain variation for the audio signal along each block of the gain controller is shown in FIG. 7, whereby the frequency characteristic of the tone controller 1 is set as it is shown in FIG. 4. More specifically, it is assumed that the input signal (i) to the first electronic volume controller 2 has the maximum allowable level of 0 dB for the tone controller 1. The first electronic volume controller 2 is then controlled by the microprocessor 4 in accordance with a control signal 1 for attenuating the input signal by an amount of a dB which equals to the amount of boosting for attaining the selected frequency characteristic in the tone controller 1. The signal is amplified by the amount of "a" dB within the frequency band B in the tone controller 1 in accordance with a control signal 11 fed by the microprocessor 4 without causing any level change in the frequency band A. The microprocessor also generates a control signal III simultaneously with the control signal I for the second electronic volume controller 3 and thereby controls the attenuation in the second electronic volume controller 3 to attenuate the signal by the amount of "c−a" dB which is given by subtracting "a" dB or the attenuation in the first electronic volume controller 2 from "c" dB or the total attenuation of the gain controller 5.

Consequently, the output signal (iv) of the second electronic volume controller 3 is equivalent to the input signal (i) attenuated by the amount of "c" dB in the frequency band A and "c−a" dB in the frequency band B.

It will be apparent from the foregoing description that the output level (iii) of the tone controller never exceeds 0 dB level and the setting of the frequency characteristic at the tone controller 1 is well reflected in the output signal.

Besides the present invention, it may be possible to keep the input signal not to exceed the maximum allowable input level of the tone controller by attenuating the input signal level sufficiently low in consideration of an estimated amplification at the tone controller, however, this makes the S/N ratio worse and spoils the tone quality considerably. Therefore, the gain controller in accordance with this invention is significant in respect of the S/N ratio as it will be kept preferable.

In the embodiment of the present invention as described above, the total attenuation of the gain controller 5 has been considered to be larger than the gain attained in either frequency band of the tone controller, however, if the total attenuation of the gain controller is less than the gain to be attained in the tone controller, an amount of attenuation at the first electronic volume controller 2 should be limited not to exceed the amount of attenuation being set for the whole system provided that the attenuation at the second electronic volume controller 3 is 0 db.

Although the invention has been described with reference to the preferred embodiment wherein the signal in the certain frequency band is amplified in the tone controller 1. however, in case of attenuating the signal in the tone controller, the attenuation at the first electronic volume controller 2 will be ceased under the control of the microprocessor 4.

Figure 8:
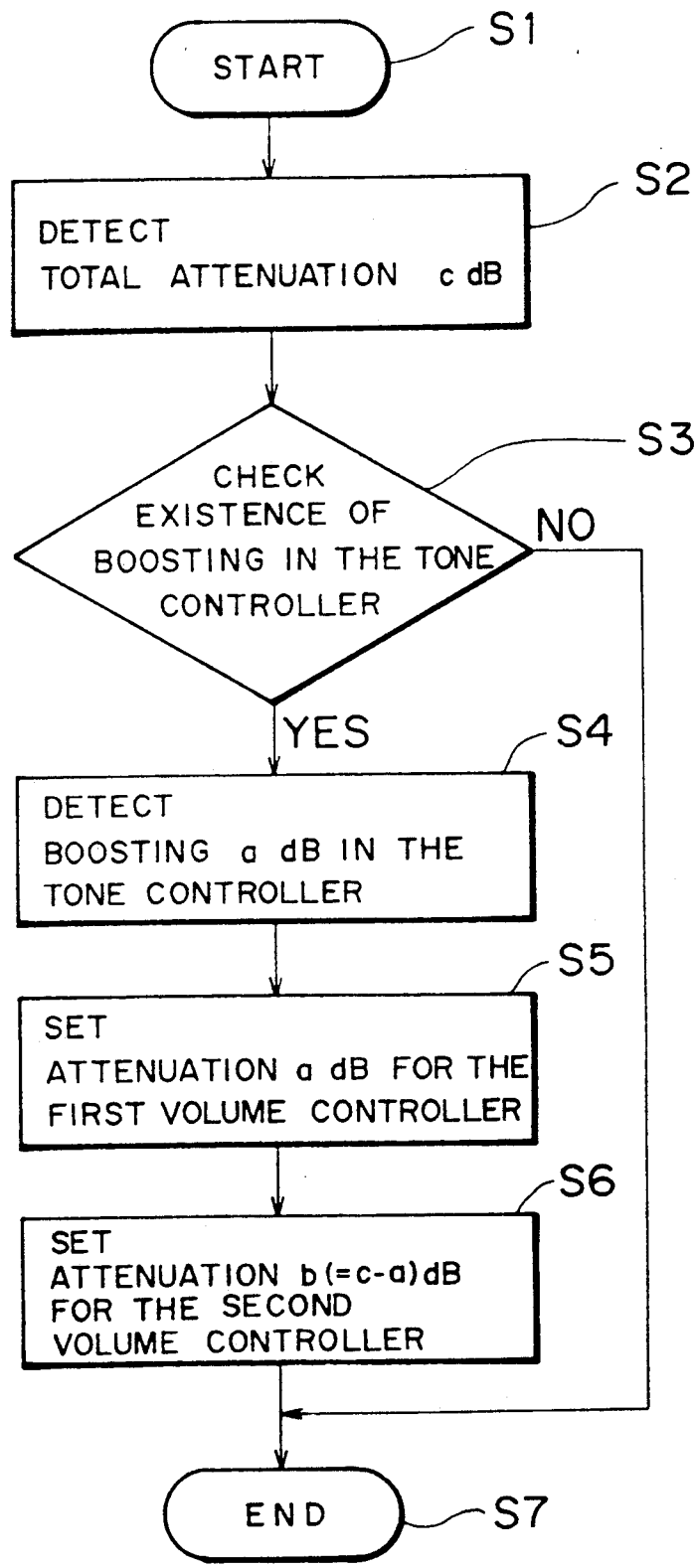
FIG. 8 is a flow chart showing the operation of the microprocessor in the embodiment of this invention.

The operation of the microprocessor 4 will now be described with reference to the flow chart shown in FIG. 8. The microprocessor initiates the operation with a first step S1 wherein the whole system is initially set to have a predetermined amount of attenuation with an input device such as a switch (not shown) and the power source is turned ON. The set value "c" dB for the attenuation of the whole system is detected by the microprocessor 4 at step S2 from the status of the input device such as the switch. It is then determined by the microprocessor 4 at step S3 whether or not an amount of boosting has been set in the tone controller 1 from the status of another input device such as a switch and the like (not shown). If it has, the amount of boosting "a" dB is detected at step S4. Whereas if it has not, the program goes directly to step 7. An amount of attenuation of the first electronic volume controller 2 is determined at step S5 on the basis of the detected value "a" dB and the control of the microprocessor 4. An amount of attenuation "b" dB of the second electronic volume controller 3 is in turn determined at step S6. Whereas the amount of attenuation is determined from the equation $b = c - a$ dB. A series of control operation will end at step 7.

While the invention has been described with reference to the embodiment wherein the tone controller 1 is used for the frequency characteristic controller. It will, however, be apparent that many modification may be made, for example, a graphic equalizer, which is one of the frequency characteristic compensators, that can control a gain independently for a plurality of frequencies may be substituted for the tone controller.

In the modification considered above, it is obvious to those skilled in the art that the amounts of attenuation of the first and the second electronic volume controllers 2, 3 are determined similarly by the microprocessor 4 basing on the frequency characteristic set on the graphic equalizer.

Further, even in a digital signal processing, it is preferable that the attenuation of a signal level should be kept as small as possible and the upper limit of the signal level should be kept within the maximum value to be afforded. Accordingly, it is needless to say that the same advantages heretofore described can also be attained by an preferred embodiment of this invention even in the digital signal processing.

It should be appreciated from the foregoing description that the present invention provides an improved gain controller for minimizing the attenuation for an input signal and preventing the deterioration of S/N ratio as well as the occurrence of clipping distortion at the frequency characteristic control stage.

Although the present invention has been described in detail with reference to the presently preferred embodiment of the invention, it should be understood by those skilled in the art that various modification can be made without departing from the spirit and scope of the invention, therefore, this invention is not to be limited except as by the appended claims.

What is claimed is:

1. A gain controller comprising:
    a first electronic volume controller for attenuating an input signal;
    a frequency characteristic controller for accepting an attenuated output of the first electronic volume controller and for setting a frequency characteristic;
    a second electronic volume controller for attenuating an output of the frequency characteristic controller; and
    a microprocessor for controlling the first electronic volume controller, the second electronic volume controller and the frequency characteristic controller in a cooperative manner,
    whereby attenuating the input signal at the first electronic volume controller by an amount equal to an amount of boosting set at the frequency characteristic controller, and attenuating the output of the frequency characteristic controller at the second electronic volume controller by an amount equal to a difference between a desired overall attenuation and an attenuation applied at the first electronic volume controller.

2. A gain controller as defined in claim 1, wherein the frequency characteristic controller comprises a tone controller for boosting the signal level at higher and/or lower frequency bands.

3. A gain controller as defined in claim 1, wherein the frequency characteristic controller comprises a tone controller for attenuating the signal level at higher and/or lower frequency bands.

4. A gain controller as defined in claim 1, wherein the frequency characteristic controller comprises a graphic equalizer.

5. A gain controller as defined in claim 1, wherein the first and the second electronic volume controllers comprise electronic variable resistors.

6. A gain controller as claimed in claim 1, wherein the input signal is a digital signal, and the first and the second electronic volume controllers comprise digital signal processors.

7. A gain controller as defined in claim 2, wherein the first and the second electronic volume controllers comprise electronic variable resistors.

8. A gain controller as defined in claim 3, wherein the first and the second electronic volume controllers comprise electronic variable resistors.

9. A gain controller as defined in claim 4, wherein the first and the second electronic volume controllers comprise electronic variable resistors.

10. A gain controller as claimed in claim 2, wherein the input signal is a digital signal, and the first and the second electronic volume controllers comprise digital signal processors.

11. A gain controller as claimed in claim 3, wherein the input signal is a digital signal, and the first and the second electronic volume controllers comprise digital signal processors.

12. A gain controller as claimed in claim 4, wherein the input signal is a digital signal, and the first and the second electronic volume controllers comprise digital signal processors.

13. A method of gain control that avoids clipping without unnecessarily decreasing signal quality, comprising the steps of:
    boosting said signal in a frequency-selective manner;
    prior to said boosting, attenuating said signal by an amount equal to a greatest boosting amount to be applied to said signal during said boosting; and
    after said boosting, attenuating said signal by an amount equal to a difference between a desired overall attenuation and an attenuation applied in the previous attenuating step.

* * * * *